(12) United States Patent
Van Treuren et al.

(10) Patent No.: US 7,149,943 B2
(45) Date of Patent: Dec. 12, 2006

(54) SYSTEM FOR FLEXIBLE EMBEDDED BOUNDARY SCAN TESTING

(75) Inventors: Bradford G. Van Treuren, Lambertville, NJ (US); Jose M. Miranda, Hamilton, NJ (US); Paul J. Wheatley, Titusville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 348 days.

(21) Appl. No.: 10/756,689

(22) Filed: Jan. 12, 2004

(65) Prior Publication Data

US 2005/0154949 A1 Jul. 14, 2005

(51) Int. Cl.
*G01R 31/28* (2006.01)
*G06F 17/50* (2006.01)

(52) U.S. Cl. .................. 714/727; 714/30; 714/733; 714/734; 716/1; 716/4

(58) Field of Classification Search ............. None
See application file for complete search history.

(56) References Cited

U.S. PATENT DOCUMENTS

| | | | |
|---|---|---|---|
| 6,223,180 B1 * | 4/2001 | Moore et al. ............ 707/100 |
| 6,594,802 B1 | 7/2003 | Ricchetti | |
| 6,662,134 B1 | 12/2003 | Moore | |
| 6,678,875 B1 * | 1/2004 | Pajak et al. ............ 716/11 |
| 6,763,488 B1 * | 7/2004 | Whetsel ............ 714/729 |
| 6,769,080 B1 * | 7/2004 | Whetsel ............ 714/729 |
| 6,823,497 B1 * | 11/2004 | Schubert et al. ............ 716/4 |
| 6,931,572 B1 * | 8/2005 | Schubert et al. ............ 714/34 |
| 6,957,371 B1 * | 10/2005 | Ricchetti et al. ............ 714/733 |
| 2003/0009715 A1 | 1/2003 | Ricchetti | |
| 2003/0106004 A1 | 6/2003 | Ricchetti | |
| 2003/0140255 A1 | 7/2003 | Ricchetti | |
| 2003/0145286 A1 * | 7/2003 | Pajak et al. ............ 716/1 |

OTHER PUBLICATIONS

Ellis, Margaret A. and Stroustrup, Bjarne; The Annotated C++ Reference Manual; Chap. 10.2 Virtual Functions, pp. 208-209; Addison-Wesley Publ. Co.; USA.

Collins, Pete; Design Considerations in Using 1149.9 as a Backplane Test Bus; Presentation at 2003 International Test Conference; IEEE/TTTC Board Test Workshop 2003, Charlotte, N.C., USA, Oct. 3, 2003.

Van Treuren, Bradford G. and Miranda, Jose M.; Embedded Boundary Scan; IEEE Design & Test of Computers, Mar.-Apr. 2003.

* cited by examiner

*Primary Examiner*—Phung My Chung (57) ABSTRACT

A flexible Boundary Scan test system is disclosed. The system includes an interpreter module operable to execute a program element selected from a plurality of program elements that include at least one instruction type having an interface to identify and execute selected functions wherein each of the selected functions has associated therewith at least one data information item. In one aspect of the invention, selected ones of the functions are composed of a plurality of functions. In another aspect of the invention, the instruction includes parameters and adornments for determining the selected function execution.

13 Claims, 12 Drawing Sheets

SYSTEM FOR FLEXIBLE EMBEDDED BOUNDARY SCAN TESTING

FIELD OF INVENTION

The present invention is related to electronic printed circuit board and system assembly testing and more specifically to provide a flexible method for implementing tests for embedded Boundary Scan testing.

BACKGROUND OF THE RELATED ART

As integrated circuit packaging technology has decreased in size, the ability to determine functionality and continuity of electronic assemblies has become increasingly more difficult. Integrated circuit boundary scan features are well known in the art and is typically used in Personal-Computer (PC) based tests and in Automatic Test Equipment (ATE) testing used in manufacturing. An example of Boundary-Scan testing is disclosed in U.S. Pat. No. 6,594,802, entitled "Method and Apparatus for Providing Optimized Access to Circuits for Debug, Programming and Test, issued Jul. 15, 2003 to Ricchetti, et al.

An advantage of Boundary Scan testing is that it is structural in nature and is amenable to explicit coverage metrics. Boundary Scan features for testing have also been expanded to both the board and the system level. In the embedded environment, board-level tests are typically functional tests that target specific board operations, while system level testing allows for functional testing of particular hardware modules and/or their interaction. An example of board and system level Boundary Scan testing is disclosed in USPPA No. U.S. 2003/0009715 A1, entitled "Method and Apparatus for Optimized Parallel Testing and Access of Electronic Circuits," filed on Apr. 9, 2002, by Ricchetti, et al.

Current methods of embedded Boundary Scan testing may use microprocessor-based or specialized co-processor-based programs to take advantage of programmable technology. However, current methods are limited in that the tests are specific to the connectivity of the existing board level integrated circuit configuration. Thus, when a new board configuration is used, the microprocessor-based Boundary Scan programs must be altered to accommodate the new configuration. As has been found, altering such programs is a time- and labor-intensive process as the new functions must be tested to insure they work properly and existing functions must be re-tested to establish that their operation was not altered by the new changes. USPPA No. 2003/0106004, entitled "Method and Apparatus for Embedded Built-In Self-Test (BIST) of Electronic Circuits and Systems," filed May 10, 2002, by Ricchetti, et al., discloses a method for downloading externally based test programs and data into embedded systems to avoid duplication of effort in developing test programs that may be used both from an external computer or an internal controller. However, this method is limited as once a start address is determined the testing continues until the end of the scan vectors for the selected scan block vector suite is reached. Hence, the order of the tests is fixed by the data downloaded into the memory and the memory must be reloaded to provide for a different order or the addition of new tests.

Furthermore, the prior art only provides for rudimentary conditional flow control in the order of jumps and if-then conditionals. Thus the embedded BIST approach does not lend itself well to reliability testing, such as Environmental Stress Test (EST), where a sequence of operations must be performed repetitively for a specific period of time or when an error condition is detected. The prior art is also limited in scope in what test functions can be performed as, typically, there is a single static vector test format available to perform Boundary Scan operations. Furthermore, the prior art fails to provide adequate support for product testing over the entire product life cycle as part of a Built-In test strategy. Further still, as new industry standards and features are introduced to solve specific test problems, support for these new features must be available in the embedded test system. One such feature is the ability to support dynamic vector creation and analysis to reduce the time it takes to program logic devices, which is not available in the art.

Thus, there is a need in the industry for a method that allows for a more flexible means for providing Boundary Scan test and programming support to accommodate new standards, configurations and flexibility in the order of test execution without incurring time-intensive re-programming and re-testing of the BIST software.

SUMMARY OF INVENTION

A flexible Boundary Scan test system is disclosed. The system includes an interpreter module operable to execute a program element selected from a plurality of program elements that include at least one instruction type having an interface to identify and execute selected functions wherein each of the selected functions is associated with at least one data information item. In one aspect of the invention, selected ones of the functions are composed of a plurality of second functions. In another aspect of the invention, the instruction includes parameters and adornments for determining the selected function execution.

It is to be understood that these drawings are solely for purposes of illustrating the concepts of the invention and are not intended as a definition of the limits of the invention. The embodiments shown in figures herein and described in the accompanying detailed description are to be used as illustrative embodiments and should not be construed as the only manner of practicing the invention. Also, the same reference numerals, possibly supplemented with reference characters where appropriate, have been used to identify similar elements.

DETAILED DESCRIPTION

Figure 1:
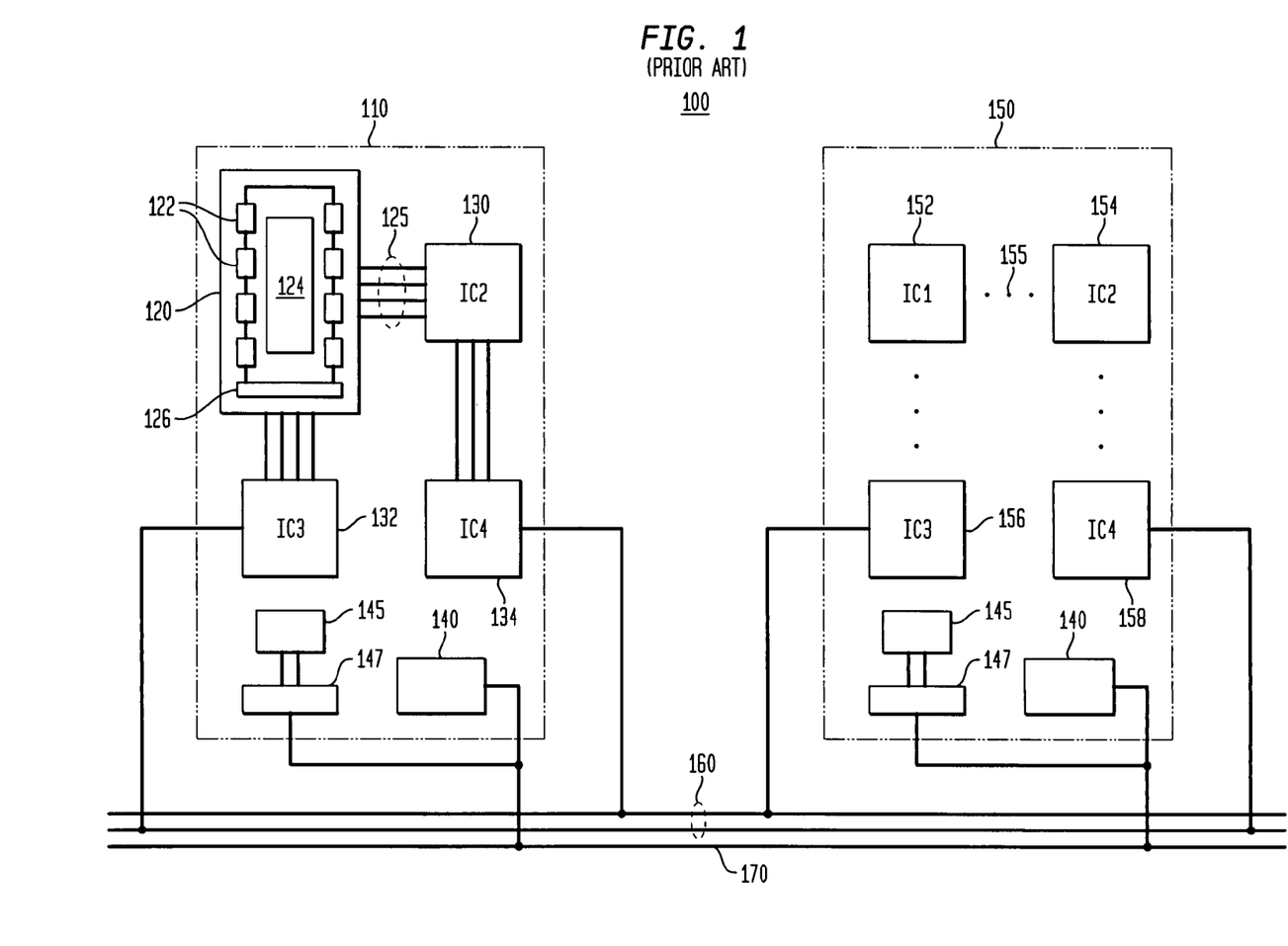
FIG. 1 illustrates a conventional Boundary Scan test system configuration.

FIG. 1 illustrates a conventional Boundary Scan test system configuration 100 including details of both board and integrated circuit tests. More specifically, system 100 is composed of boards 110 and 150 communicating via bus 160. Board 110 includes a plurality of integrated circuits 120, 130, 132 and 134, which are in communication via interconnection tracks 125, for example. Board 150, similarly, includes a plurality of integrated circuits 152, 154, 156, and 158, in communication via interconnection tracks 155. Integrated circuit 120 illustrates a conventional Boundary Scan configuration wherein core logic 124 is surrounded on the boundary of integrated circuit 120 with programmable cells 122. Typically, the programmable cells 122 are "daisy-chained" together to allow data to be passed from one cell to the next. Test Access Port (TAP) controller 126 provides a control means to route serial input signals, i.e., Test Data In (TDI), for setting and clearing individual cells 122. The settings of cells 122 on integrated circuit 120 may be applied to interconnection tracks 125 and then observed at corresponding integrated circuit 130 cells. Observations are reported serially using Test Data Out (TDO) signals thereby testing the connectivity of interconnection tracks 125. The Institute of Electrical and Electronic Engineers (IEEE) standard 1149.1, which is incorporated by reference herein, provides standards regarding test signals for Boundary Scan testing. Operation of IEEE1149.1 standard is disclosed in "Design Consideration in Using 1149.1 as a Backplane Test Bus", Pete Collins, IEEE/TTTC Board Test Workshop 2003, Oct. 3, 2003.

For a plurality of boards, IEEE 1149.1 standard typically requires a wired serial communications link between a TDO signal port of a proceeding unit under test (UUT) and a TDI signal port on a subsequent UUT. Gateway modules 140, on boards 110 and 150, are used as a common communication access module that bridges the IEEE 1149.1 signals on the backplane to one circuit board at a time. In another aspect, some gateway modules allow for broadcast of information to all boards simultaneously. Gateways 140 are in communication via a Boundary Scan test bus, 170.

Central processing units (CPUs) 145 and test bus controllers 147 on boards 110 and 150 are used to control signals and execute programs that may be used to test communications between individual integrated circuits, e.g., 120 and 130, or among other integrated circuits, e.g., 132 and 134, or between boards, e.g., integrated circuits 134 and 156. Although boards 110 and 150 are depicted containing CPUs, it would be recognized by those skilled in the art that only a single board is required to include a CPU that may be used to perform system level tests. CPU 145 typically contains executable program code and test data, e.g., test patterns, used to test particular integrated circuits and the connections therebetween.

Figure 2:
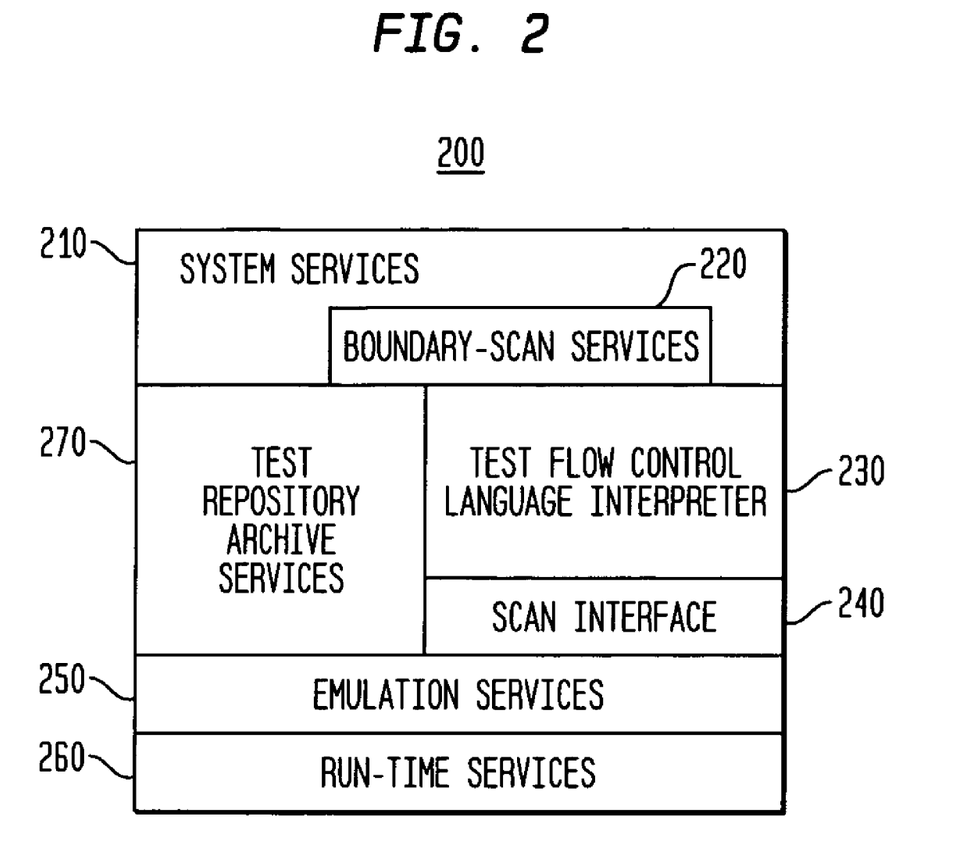
FIG. 2 illustrates a Boundary Scan test architecture in accordance with the principles of the present invention.

FIG. 2 illustrates a software architecture 200 for Boundary Scan testing in accordance with the principles of the invention. In this exemplary architecture, system services 210 represents an application software or a function test environment software used in the system. The role of this service is to control when tests are applied to the UUT. Boundary Scan Services 220 represents the application programming interface for controlling the application of the Boundary Scan Test (BST) to the UUT. Test Flow Control Language (TFCL) Interpreter 230 is responsible for executing the directives found in the TFCL programs. The purpose of TFCL 230 is to separate the flow of control in the embedded BST system from the software that is written to support embedded BST. In another aspect, this system may be used externally as a PC based tester. A TFCL program represents one or more tests, i.e., TestStep, that are to be applied to the UUT. For Boundary Scan testing, this may be a single test pattern or may be a set of test patterns. Scan Interface 240 represents the device driver interface for the Boundary Scan Services. Each specialized interface is responsible for communicating with a specific Boundary Scan hardware TAP. Emulation services 250 provides necessary support functions for Boundary Scan Services 220 when these services are not available in the run-time environment libraries. Run-time services 260 are the services provided by the run-time environment. For example, Run-time services 260 may represent a host operating system.

Test Repository Archive (TRA) Services 270 represents data files and corresponding access functions associated with specific sets of tests to be applied to the UUT. Test repository archive 270 data may be stored in a local ROM/Flash memory or downloaded from a host computer or server and linked with the Run-time services 260. In one aspect, TRA 270 is a binary data block of compressed file images. The contents of a TRA 270 include TFCL program files, persistent Test Step Objects, Boundary Scan Vector (i.e., test pattern) files, Diagnostic Lookup tables and other files necessary to perform a complete test suite on the UUT.

Figure 3:
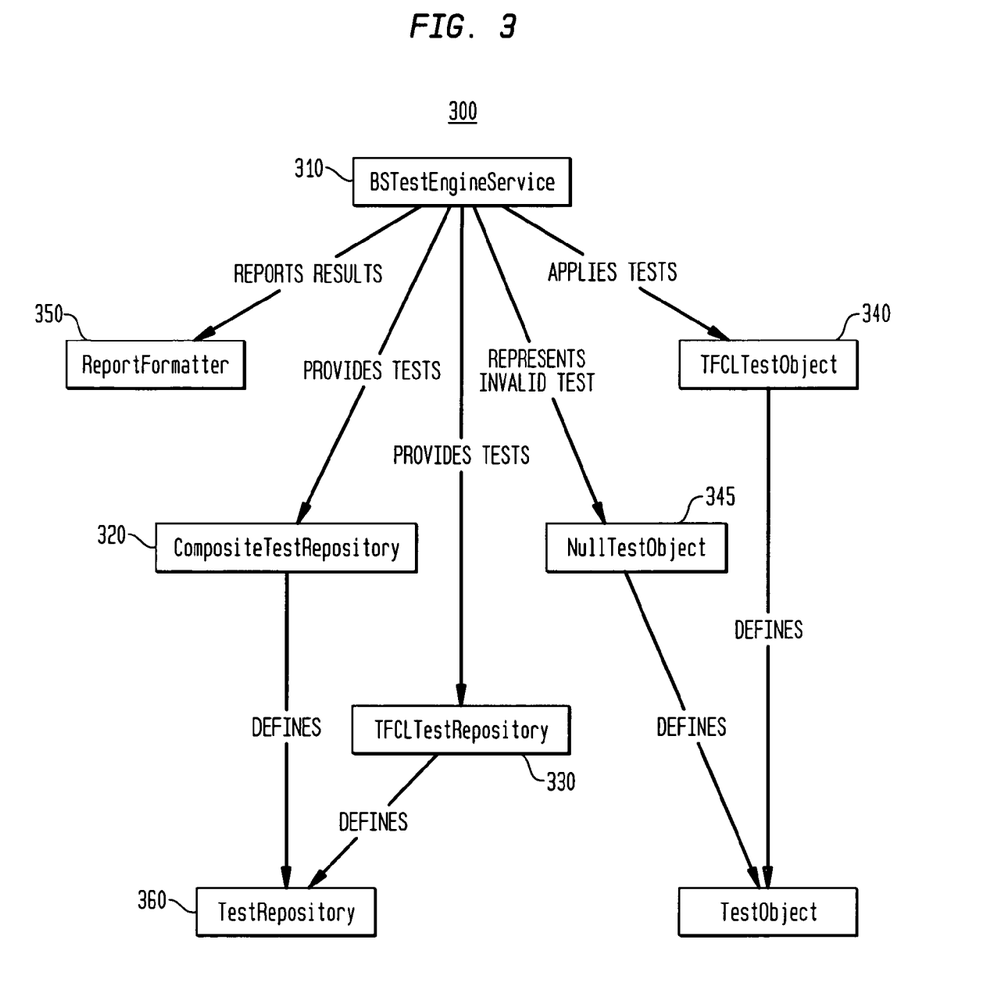
FIG. 3 illustrates a block diagram of Boundary Scan services module.

FIG. 3 illustrates a block diagram of Boundary Scan Services module 300 composed of test engine 310 in communication with specialized Test Repository Interface Definitions (TRID) 360, TFCL Test Object 340, Null Test Object 345 and Report Formatter 350. TRID 360 defines the interface for each specialized class used by the test engine 310. The Composite Test Repository (CTR) 320 and TFCL Test Repository (TTR) 330 are specializations of the TRID 360. Each of the specialized classes manages data blocks viewed in the Test Repository Archive 270 (FIG. 2). In one aspect, a specialized class may filter out files presented to the test engine 310 so only those files of interest to the system services 210 (FIG. 2) are obtained when the service is queried for tests. TFCL Test Repository 330 represents a specialization of Test Repository 360 which is responsible for filtering Test Repository Archive 270 data so only TFCL programs are visible to system services 210. TFCL Test Repository 330 is also responsible for locating and constructing a TFCL Test Object 340 to be applied to the UUT. Composite Test Repository 320 extends the functionality of the Test Repository class 360. It provides the means for concatenating multiple Test Repository 360 objects together to behave as a single Test Repository object. Test Object 340 defines the interface for specialized test objects. A test object is the smallest unit of test that may be applied to UUT by the Systems services 210. TFCL Test Object Class 340 represents a TFCL program that is to be applied to the UUT by system services 210. Null Test Object 345 defines an object that is used when Test Repository 360 is unable to locate a requested Test Object.

Figure 4:
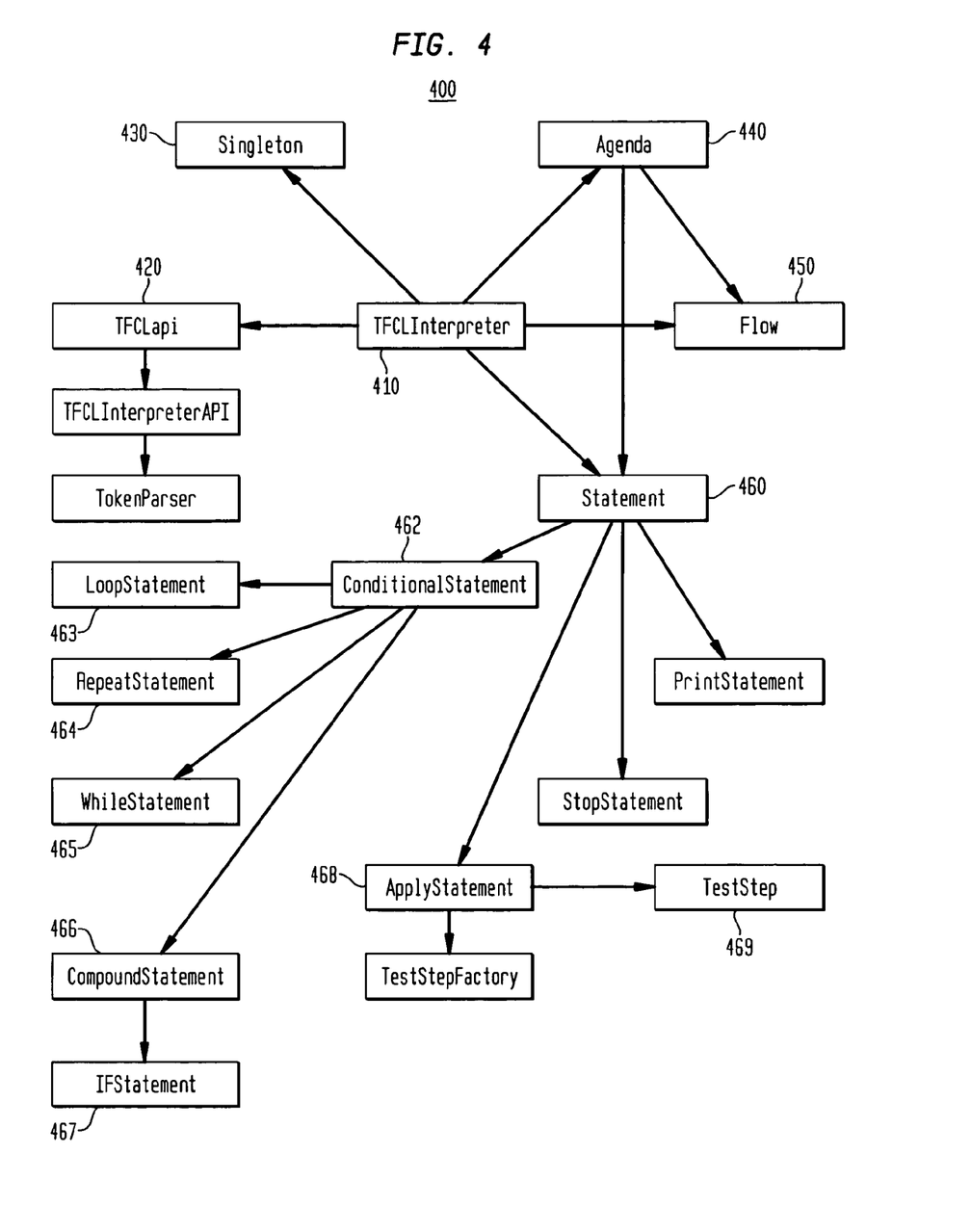
FIG. 4 illustrates an exemplary block diagram of a TFCL Interpreter module in accordance with the principles of the invention.

FIG. 4 illustrates a block diagram 400 of the elements of TFCL Interpreter module 410. TFCL Interpreter module 410 provides the interface to load and run test programs as well as manage errors that are detected during execution of a selected test program. As shown, TFCL Interpreter module 410 is in communication with modules or classes, TFCLapi 420, Singleton 430, Agenda 440, Flow 450 and Statement 460. Agenda 440 maintains the order that statements are to be applied in a test program. TFCL Interpreter module 410 initially includes statements that are ordered in Flow object 450 by a TFCL program file. TFCLapi 420 represents the interface defined by TFCL Interpreter module 410 to populate the appropriate objects within the interpreter module. This class is used as a base class for all parsers interfacing with TFCL Interpreter module 410. Singleton 430 is responsible for ensuring only one copy of key TFCL objects exist in a single run-time execution. Flow object 450 represents a procedural block in a TFCL program. It orders all statements contained within the program block. Statement 460 represents an interface class defining the base structure for all statement objects in TFCL Interpreter module 410.

Conditional Statement 462 is representative of common statement behavior that relies on known conditions to execute. Statements such as LOOP 463, REPEAT 464, WHILE 465, Compound statements (IF or IF/THEN/ELSE) 466 are conditional statements known in the art. More specifically, LOOP statement 463 allows a block of code to be executed in a loop until an event, either internal or external, is applied or a desired number of iterations or loops are achieved. REPEAT 464 represents a statement that is applied to a block of code and conditionally repeats the block after the first execution of the code. WHILE statement 465 is responsible for testing if the condition is true prior to executing any of the contained statements. If the condition is true, the object places its contained statements at the head of the Agenda object 440 for execution. Compound statement 466 is composed of IF and IF/THEN/ELSE statements. IF defines a condition to be tested when that line of code is reached. If the condition evaluates to a "true", the block of code defined by the "then" clause is executed. If the condition evaluates to a "false", the block of code defined by the "else" clause is executed, but only if an "else" block is specified.

APPLY statement 468 provides for many different behavioral options to the execution of this statement. APPLY 468 is responsible for identifying a Test Step 469, i.e., function, to be applied and ensures the appropriate Test Step handler is in place, dynamically, to support the action desired.

APPLY statement 468 is used to access the test step extension to the TFCL language. The APPLY statement further provides instruction to the designated test step that is the intent of the desired execution. For example, APPLY identifier DIAGNOSE;
represents the execution of a test step instruction, having a parameter referred to as "identifier," that is applied to the UUT and an optional parameter DIAGNOSE that determines the diagnostic to be performed on failing results. Identifier represents the named instances of specialized test step operations that are to be applied at that point of the sequence flow. These identifiers represent persistent copies of the TestStep object state that are defined in the Test Repository Archive 270 as TestStep files. The name of the identifier parameter may be determined by a user's preferences or desires.

Figure 5:
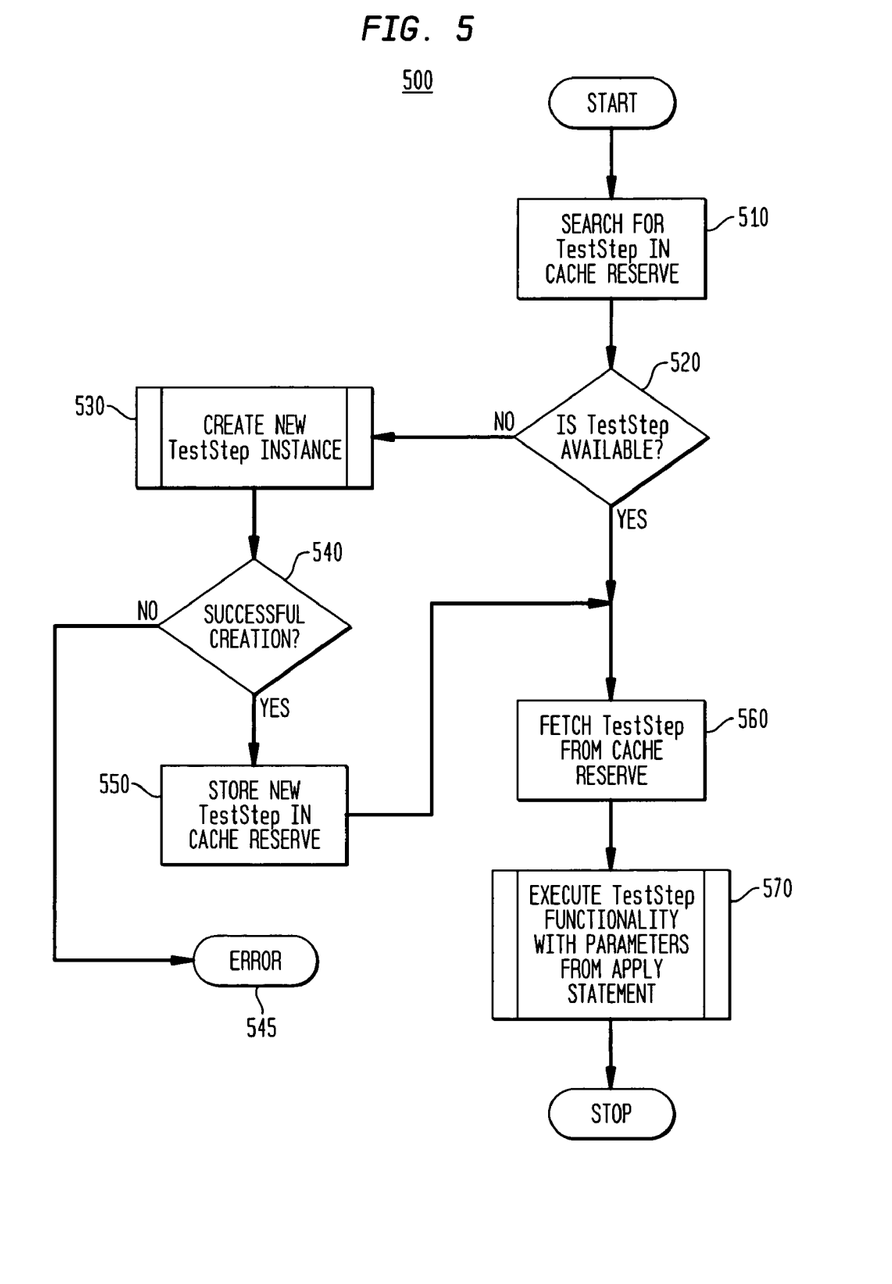
FIG. 5 illustrates an exemplary flow chart of the polymorphic APPLY function in accordance with the principles of the invention.

FIG. 5 illustrates an exemplary flow chart 500 of the APPLY statement 468 process flow and follows the ability of virtual functions in the C++ language as described in "The Annotated C++ Reference Manual," Ellis, et al., Addison-Wesley Publishing, 1990, pp. 208–209. In this illustrated process flow, a search for a TestStep object in a memory resident cache reserve is made. At block 520 a determination is made whether the requested TestStep object is available. If the answer is negative, then at block 530 a process is initiated to create the requested TestStep object. At block 540 a determination is made whether the requested TestStep object was successfully created. If the answer is negative, then an error is indicated at block 545.

If, however, the answer at block 540 is in the affirmative, then the newly created TestStep object is added to the cache reserve. Processing proceeds to block 560 where the requested TestStep object is obtained from the cache reserve. At block 570 the requested TestStep is then executed.

Examples of APPLY statement 468 are represented as:

a. APPLY identifier DIAGNOSE CELL;
   which operates to report the device Boundary Scan cell number when a failure is observed
b. APPLY identifier DIAGNOSE LINE;
   which operates to report the TFCL line number and failing vector number for the observed failure
c. APPLY identifier DIAGNOSE PIN; which refers to displaying the device pin name where failure was observed:
d. APPLY identifier DIAGNOSE NET;
   which operates to report the UUT net name where the failure is observed
e. APPLY identifier DIAGNOSE VECTOR;
   which operates to report the raw vector data where the observed failure is detected.
f. APPLY identifier DIAGNOSE MAXFAIL=#times;
   which operates to abort the TFCL program execution if #times failures occurred during this test.
g. APPLY identifier DIAGNOSE LINE PIN NET CELL VECTOR MAXFAIL=1;
   which operates to report all the defined diagnostic information specified.
   where CELL, LINE, PIN, NET, and VECTOR are adornments for the DIAGNOSE option that indicate the type of failure reporting is requested.

Figure 6:
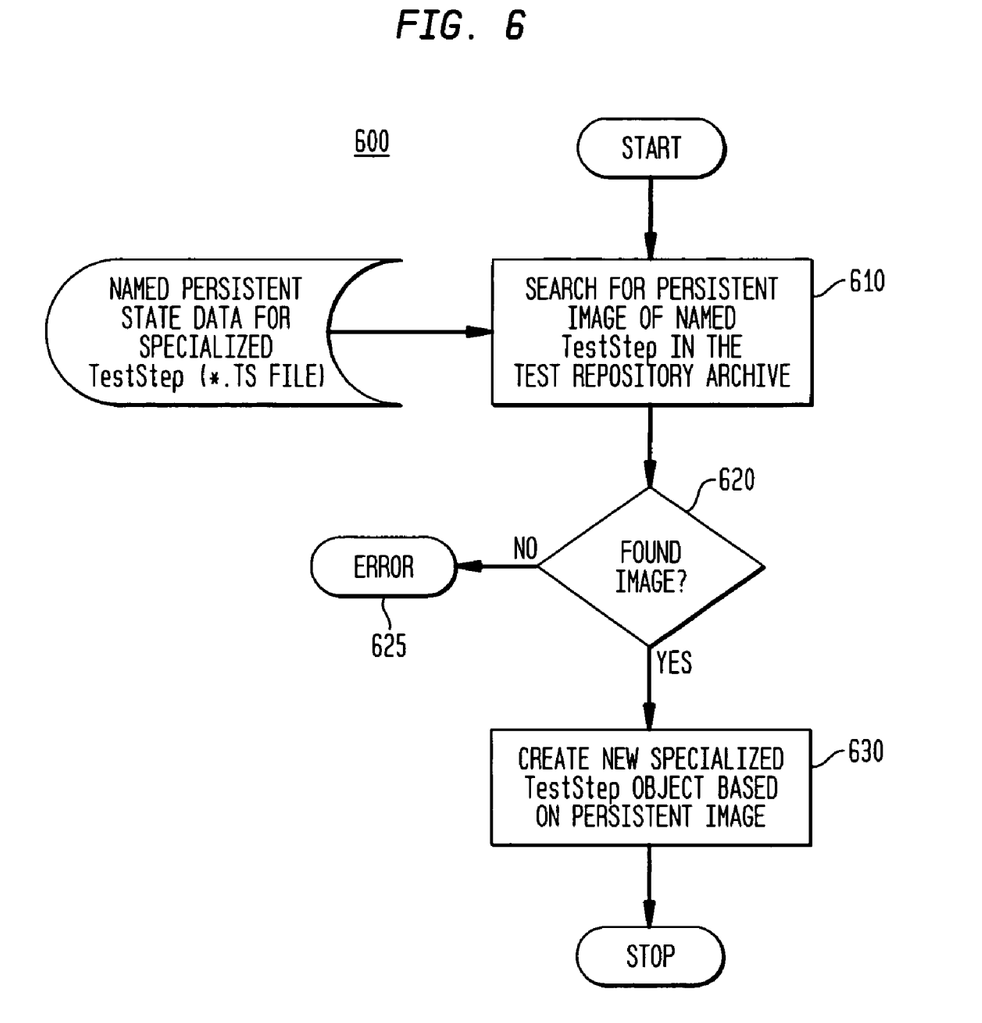
FIG. 6 illustrates a flow chart for creating a test step in accordance with the principles of the invention.

FIG. 6 illustrates an exemplary flow chart 600 of the TestStep object create block 530 shown in FIG. 5. In this illustrated flow chart, a search of the requested TestStep object is performed at block 610. This search is performed in the Test Repository Archive Service 270 for the TestStep object's persistent data image file. However, in one aspect, simple TestStep object, such as ASPTestStep, associated with an Addressable Shadow Protocol, may be implemented as built-in TestStep objects that do not need to be persistent in the TRA because there is no state information required for construction. Addressable Shadow Protocol is a known protocol provided by gateway manufacturers to allow to access to their multi-drop port. For example, the Texas Instrument Corporation, Dallas, Tex. provides a known protocol to access their SN74LVT8996 Addressable Scan Port, i.e., gateway 140. At block 620, a determination is made whether a TestStep object image has been found. If the answer is negative, then an error is indicated at block 625. Otherwise, a new specialized TestStep object is created based on the persistent image at block 630. In TestStep object creation, the "Type" field of the persistent image file is analyzed and used to select an appropriate construction operation required for the type of TestStep object. The appropriate construction operation is executed to initialize the requested TestStep object using the information found in the TestStep image file referred to by the "identifier" of the APPLY statement.

Figure 7:
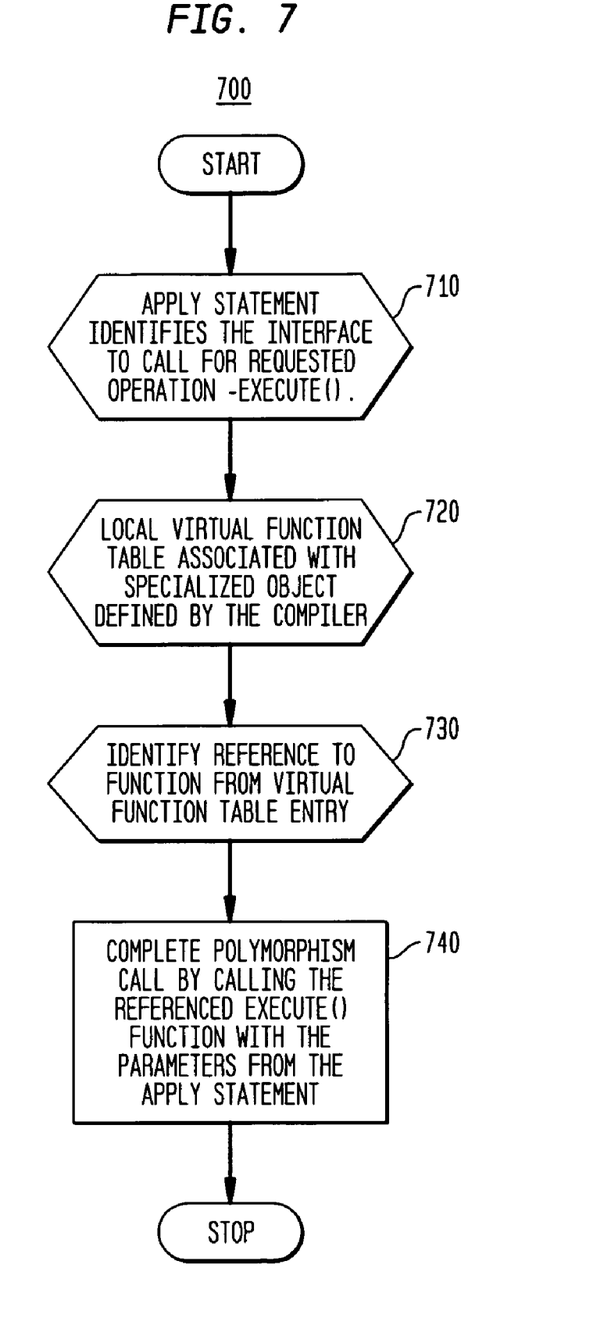
FIG. 7 illustrates a flow chart of the application of a polymorphism function in accordance with the principles of the invention.

FIG. 7 illustrates an exemplary flow chart 700 depicting dynamic selection of a specialized function executed by the APPLY statement based on a single interface representation to the interpreter. In this case, the APPLY statement provides the ability to call selected ones of a plurality of specialized functions using a virtual function interface, i.e., the same interface. This concept is conventionally referred to as polymorphism by those skilled in the art. More specifically, a selected specialized TestStep object identifier from the interface known by the APPLY statement at block 710. In this case, the TFCL APPLY statement identifies associated TestStep objects and is thus not concerned with the specialization of the TestStep objects identified. Hence, when a TestStep is to be applied to the UUT, the APPLY statement flow executes the interface function associated with the TestStep object by calling the TestStep function. At block 720, the APPLY statement software performs a table lookup to locate a virtual function identified or associated with the identified TestStep object by the compiler and resident in memory. This creates an indirect reference to the correct function associated with and matches the identified function referred to by the APPLY statement. At block 730 references associated with the identified function are next obtained. At block 740 the identified function and references are executed in association with the parameters referred to by the APPLY statement, i.e., parameters and adornments.

The use of polymorphism provides the ability to separate the points of software change when a new feature is added or removed from the entire software system to a single point that is changed transparently to the entire software. Thus, adding a new TestStep type to the software only requires adding a new specialized TestStep object to the software. All links to this new feature are automatic through the use of the APPLY statement. The only change required to the existing software is found in the TestStepFactory that needs to create a new instance of the new feature. Furthermore, the use of polymorphism provides a faster execution of the executable code as performing specific conditional tests for each object type and selecting the appropriate specialized function is removed.

In environments that fully support static object initialization at run-time, it is possible to automatically register the new specialized TestSteps with the TestStepFactory so no creation code is required to be changed.

Figure 8:
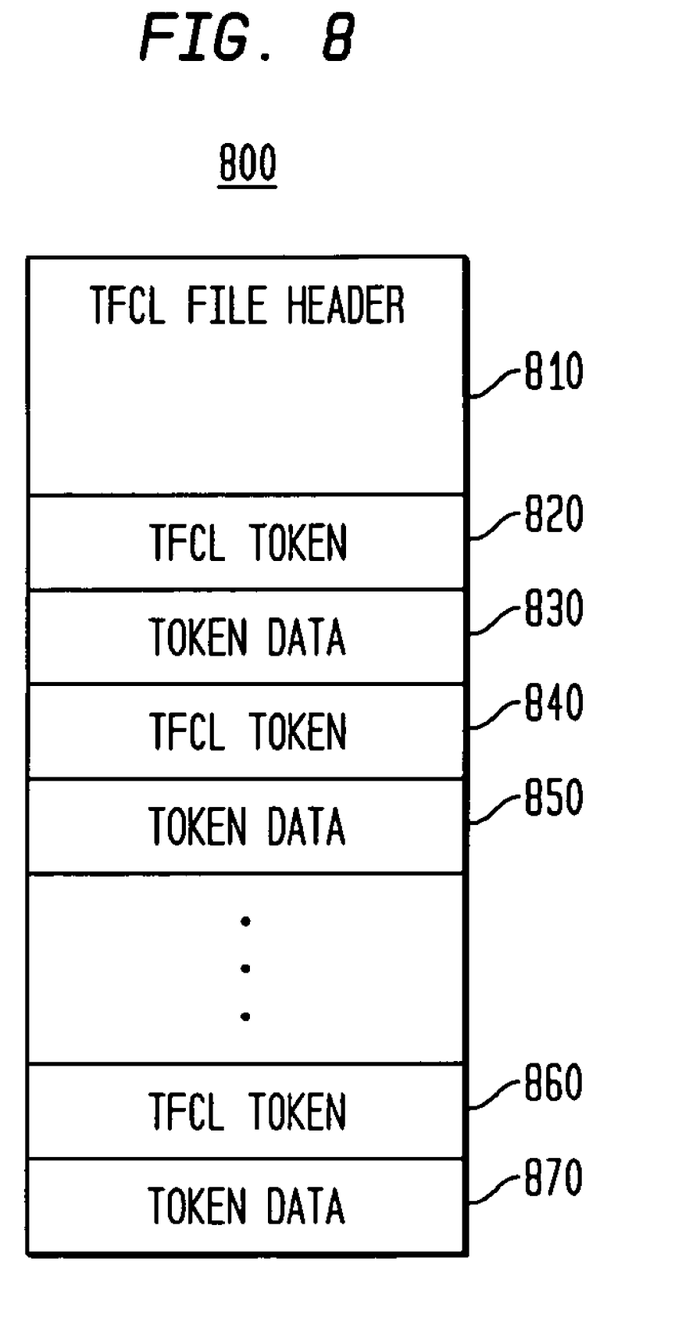
FIG. 8 illustrates an exemplary structure for a binary TFCL program file.

FIG. 8 illustrates an exemplary TFCL file format 800. The original TFCL file is an ASCII text file in the syntax of the TFCL language that gets translated into a binary TFCL file format 800. The TFCL File Header 810 stores specific information regarding the size and version of the binary information. TFCL Token 820, 840, and 860 represent the tokenized version of a TFCL statement keyword. The Token Data 830, 850, and 870 represents the information relating to the specific TFCL statement as defined in the original ASCII file. This data is specific to each statement and may contain binary representations of the ASCII data found in the original TFCL file. In one aspect, to reduce the overhead associated with parsing an ASCII file in the embedded environment, an off-line process is performed on the ASCII file wherein syntax errors and keywords are converted to tokens and placed in a binary file. The use of a preprocessed ASCII file improves the execution time of the interpreted data.

Figure 9:
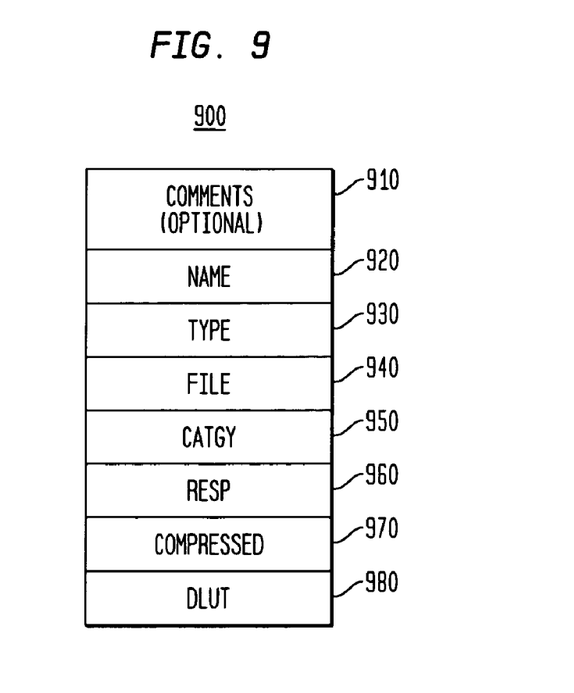
FIG. 9 illustrates an exemplary structure for a Persistent TestStep file.

FIG. 9 illustrates an exemplary structure of a Persistent TestStep object file 900. The persistent TestStep file format is represented as a property list of key and value pairs. The information is stored as an ASCII file with keywords representing specific states of the specialized TestStep object characteristics. Keywords may be selected from the group: Name 910, Type 920, File 930, Catgy 940, Resp 950, Compressed 960 and Dlut 970. Name 910 represents the name of the TestStep instance. Type 920 represents the name of the specialization TestStep object that must be instantiated for this persistent object. File 930 represents the datafile where supporting test information resides in Test Repository Archive Service 270 (FIG. 2). In one aspect, Type 930 may be associated with a Binary SVF file (see FIG. 10), and the file is the file named by the file 940 value. In this case, ".bsv" extension is implied. The value for Catgy 950 specifies an optional description of the purpose of the TestStep object to aid in diagnostics. The value of the Resp 950 key defines the name of a storage area where the resultant diagnostic data is to be preserved for systems that support a file system. The value for the Compressed 970 key defines whether the data represented by the file 940 is compressed or not. The value of the "Dlut" 980 key represents the name of the diagnostic look up table information for TestStep objects that support additional diagnostics.

Figure 10:
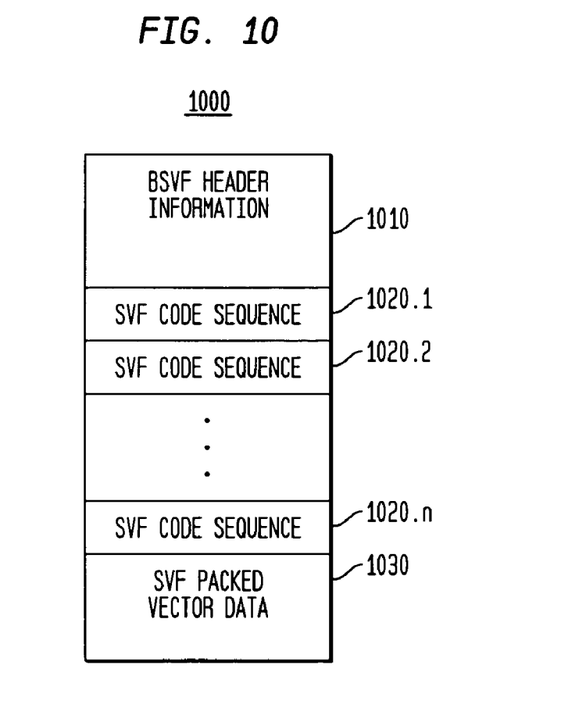
FIG. 10 illustrates an exemplary structure for a Binary SVF file.

FIG. 10 illustrates an exemplary structure 1000 of a Binary SVF file in accordance with the principles of the invention. In this exemplary structure, header information 1010 includes information regarding file size and offset information to where the SVF Code Sequences and SVF-Packed Vector Data starts. SVF code sequence 1020.1–1020.n represents "n" code sequences that may be stored within structure 1000. Each code sequence represents a single line of the original SVF vector file. The SVF Packed Vector Data 1030 block represents the raw data area where vector information is stored in a raw format and aligned on a word boundary. In this raw format, vectors may overlap or be contained as subsets of larger vectors.

Figure 11A:
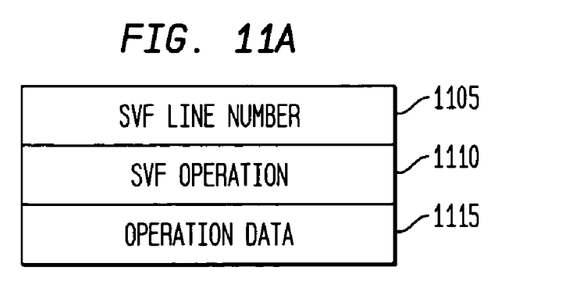
FIGS. 11a–11c illustrate exemplary structures for code sequences used in the Binary SVF file shown in FIG. 10.
Figure 11B:
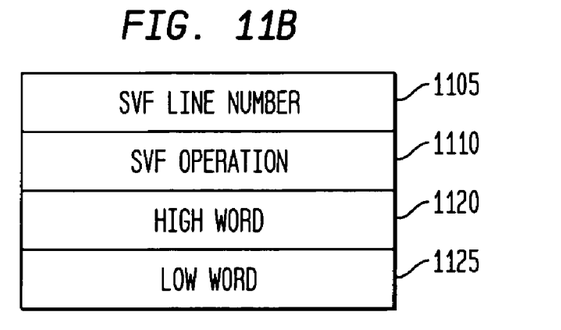
Figure 11C:
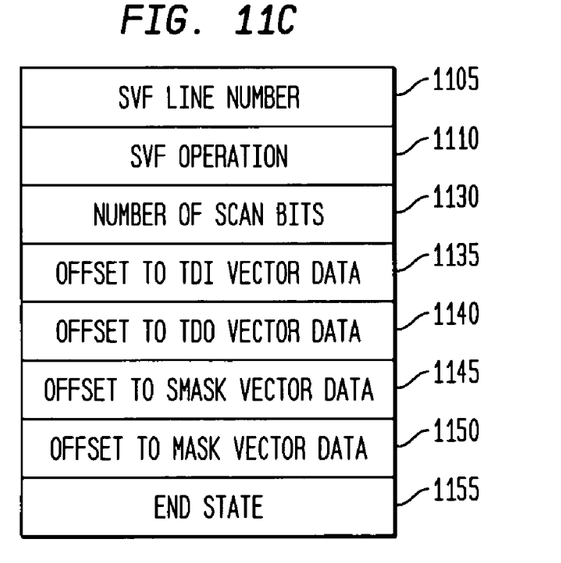

FIG. 11a illustrates an exemplary format of a single field code sequence that may represent the SVF code sequence 1020.1–1020.n (FIG. 10). This sequence represents those SVF statements not containing vector information. For example, a RESET command or a STATE IDLE command would be represented by this class of code sequence. The SVF Line Number 1105 field represents the line number where the statement resides in the original SVF file. The SVF Operation 1110 is a tokenized code representing a specific SVF command. The Operation Data 1115 represents the associated data for that operation and is stored in free form defined by the token represented in 1110. FIG. 11b illustrates an exemplary format of a double field code sequence that may represent the SVF code sequence 1020.1–1020.n shown in FIG. 10. This double field code sequence illustrates SVF statements that require numeric information. For example, the RUNTEST command taking a number of TCK ticks as its argument and is represented by this format. The High Word 1120 field represents the high order word of the 32-bit number defined by the command. The Low Word 1125 field represents the low order word of the 32-bit number defined by the command. FIG. 11c illustrates an exemplary format of a multi-field code sequence that may represent the SVF code sequence 1020.1–1020.n shown in FIG. 10. The field Number of Scan Bits 1130 represents the number of bits that are required to be scanned from the vector data pointed to by this command. This is not the same thing as the number of bits stored in the vector as, in a preferred embodiment, the vector is aligned to the nearest 16-bit size. The Offset to TDI Vector Data 1135 represents the offset from the base of the SVF Packed Vector Data 1030 where the start of the TDI Vector information resides in the raw data format. The Offset to TDO Vector Data 1140 represents the offset from the base of the SVF Packed Vector Data 1030 where the start of the TDO Vector information resides in the raw data format. The Offset to SMASK Vector Data 1145 represents the offset from the base of the SVF Packed Vector Data 1030 where the start of the SMASK Vector information resides in the raw data format. The Offset MASK Vector Data 1150 represents the offset from the base of the SVF Packed Vector Data 1030 where the start of the MASK Vector information resides in the raw data format. Finally, the End State 1155 represents the state a TAP controller must be in at the conclusion of this command execution. This must be one of the 4 stable states specified by the IEEE 1149.1 standard.

Figure 12:
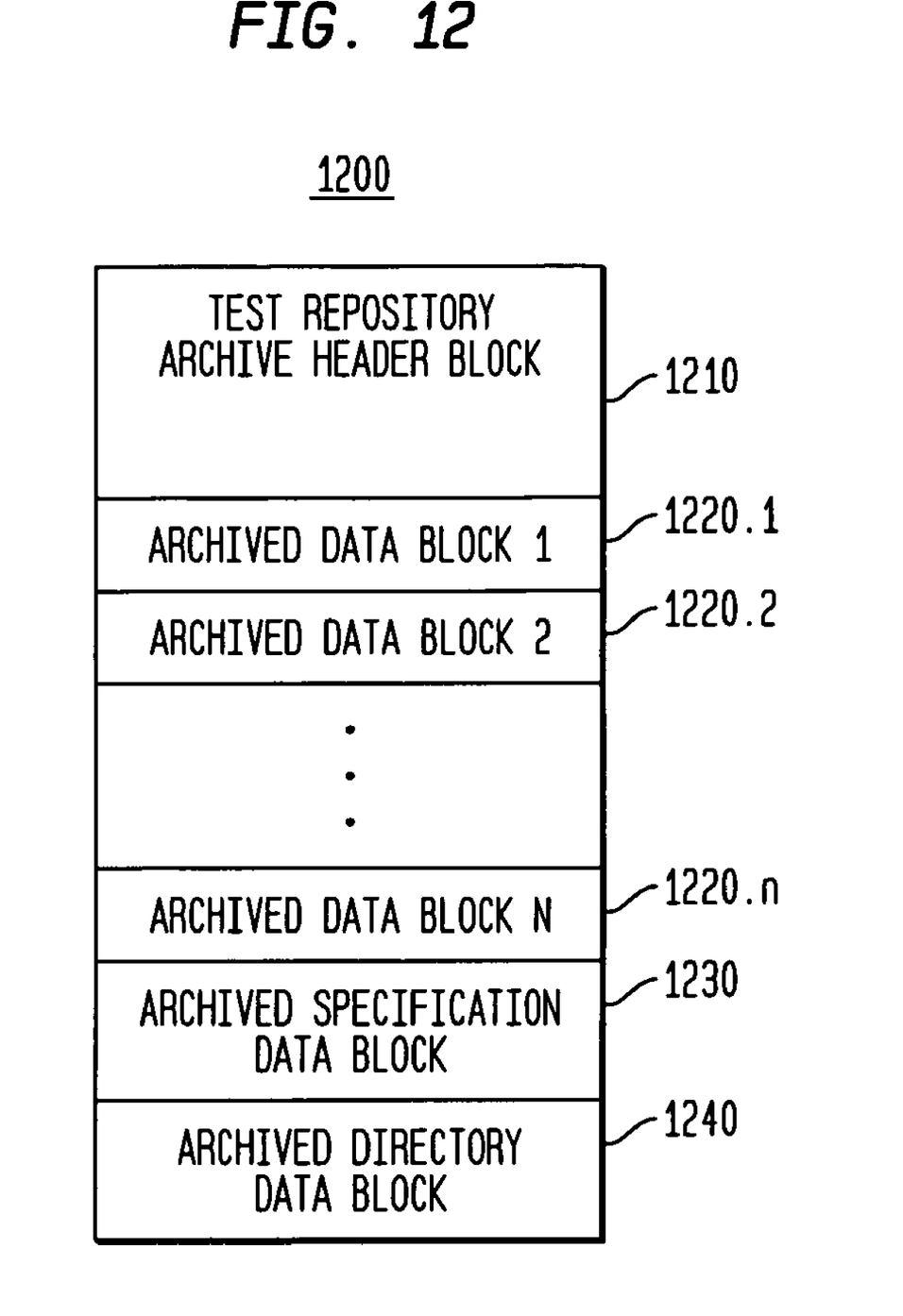
FIG. 12 illustrates an exemplary structure for a Test Repository Archive.

FIG. 12 illustrates an exemplary structure 1200 of a Test Repository Archive Service. In this exemplary structure field 1210 represents a header block that includes information regarding version information, the offset to the base of the Archived Data Blocks (1220.1–1220.n), the offset to the Archived Specification Data Block 1230, and the offset to the Archived Directory Data Block 1240 from the beginning of the image. Fields 1210.1–1210.n include information regarding "n" archived data blocks. Each archived data block represents compressed file images stored in the Test Repository Archive Service. Each file is represented by its own Archived Data Block in the repository. The Archived Specification Data Block 1230 represents information about the Test Repository Archive itself. Some of the information stored here is the time stamp of when the repository was created, the filename used to store the repository during the creation process, the path to the file in which the repository was created. The Archived Directory Data Block 1240 contains the information about each Archived Data Block and the offset to the beginning of the Archived Data Block in the archive image. Some of the information contained in the directory is the path and name where the file stored in the Archived Data Block was read in from during the creation process, the time stamp of the file that was archived, the compression algorithm used to compress the file into the Archived Data Block, the compressed image size (size of the Archived Data Block), and the uncompress file size of the image stored in the Archived Data Block. The latter is needed to provide for the correct space required to inflate the compressed image prior to its use.

An example (entitled BPTEST.TFB) of backplane/cable testing of multiple circuit boards having a multi-drop test bus may be performed using the following TFCL Boundary Scan Test program element:

```
ENTITY sys1
    FLOW sys1 IS
    APPLY ASP FROM 0 TO 0; // comment - Reset all ASPs
(i.e., Gateways)
    APPLY ASP FROM 10 TO 10 ALWAYS DIAGNOSE VECTOR;
// sel. board 1
    IF FAIL THEN
        PRINT ("failed to connect to Board 1");
        STOP;
    END IF;
    APPLY Brd1SVF FROM 1 TO 10 DIAGNOSE;// initialize board 1
    IF FAIL THEN
        PRINT ("Board 1 failed to scan initialization vectors.");
        APPLY ASP FROM 0 TO 0; // Reset all ASPs
        STOP;
    END IF;
    APPLY ASP FROM 20 TO 20 DIAGNOSE VECTOR; // select
board 2
    IF FAIL THEN
        PRINT ("failed to connect to Board 2");
        STOP;
    END IF;
    APPLY Brd2SVF FROM 1 TO 15 DIAGNOSE; // Initialize using
data from lines //1–15
```

-continued

```
    IF FAIL THEN
        PRINT ("Board 2 failed to scan initialization vectors.");
        APPLY ASP FROM 0 TO 0; // Reset all ASPs
        STOP;
    END IF;
    APPLY ASP FROM 10 TO 10; // select board 1
    IF FAIL THEN
        PRINT ("failed to connect to Board 1");
        STOP;
    END IF;
    APPLY Brd1SVF FROM 11 TO 11; // HiZ Outs
    APPLY ASP FROM 20 TO 20; // Select Board 2
    IF FAIL THEN
        PRINT ("failed to connect to Board 2");
        STOP;
    END IF;
    APPLY Brd2SVF FROM 16 TO 16; //HiZ Outs. Use data from
line 16—16
    APPLY ASP FROM 10 TO 10; // select board 1
    IF FAIL THEN
        PRINT ("failed to connect to Board 1");
        STOP;
    END IF;
    APPLY Brd1SVF FROM 12 TO 12; // apply Pattern 1
    APPLY ASP FROM 20 TO 20; // Select Board 2
    IF FAIL THEN
        PRINT ("failed to connect to Board 2");
        STOP;
    END IF;
    // Observe Pattern 1
    APPLY Brd2SVF FROM 17 TO 17 DIAGNOSE LINE PIN NET;
// Use data // from line 17—17 and on failure report line, pin and net
failure observed.
    IF FAIL THEN
        PRINT ("Vector 17 failed on Board 2");
        STOP;
    END IF;
    END FLOW;
    END ENTITY;
```

With regard to the exemplary backplane/cable process shown, the following information may be stored in the Test Repository Archive 270. The example shows the ASCII version of TFCL for a simple test. This ASCII program may be tokenized into a binary TFCL file in the format 800 shown in FIG. 8. The name of the file in the example may be BPTEST.TFB in the repository. This file would reside in its own Archived Data Block in the TRA 270. Supporting information for this file would be the TestStep object files and the associated data files containing information items for each test. For example, information regarding the ASP TestStep object may be implemented as a built-in TestStep type and the TestStep persistent file images required for this example are the images for the Brd1SVF and Brd2SVF objects. The persistent TestStep object images for the BSVF TestStep objects may be stored as files BRD1SVF.TS and BRD2SVF.TS respectively. The contents of the files may be as follows:

```
                    // BRD1SVF.TS
                        NAME = BRD1SVF
                        TYPE = BSVF
                        FILE = BRD1VEC
                        CATGY = BPTEST
                        RESP = BRD1VEC
                        COMPRESSED = NO
                        DLUT = BRD1VEC
                    // BRD2SVF.TS
                        NAME = BRD2SVF
                        TYPE = BSVF
                        FILE = BRD2VEC
```

```
CATGY = BPTEST
RESP = BRD2VEC
COMPRESSED = NO
DLUT = BRD2VEC
```

The TestStep files reference the BRD1VEC.BSV and BRD2VEC.BSV binary SVF files and associated vector data files for the test step by the FILE property respectively. The format for the vector files follows that shown in FIG. 10. There are also references to the BRD1VEC.DTB and BRD2VEC.DTB diagnostic lookup table support files by the DLUT property respectively. The format for the DLUT is an ASCII tabular file containing the global cell number in the first column, the Device Cell identifier for the second column, the Device Pin identifier for the third column, and the Net identifier for the last column.

Furthermore, in the example provided, each call of the APPLY statements referencing identifier Brd1SVF and Brd2SVF may use, as in this illustrated case, the FROM x TO y optional parameters that instruct the TestStep object to apply the designated portions of the functionality to the UUT. The x represents the starting line number in the SVF to apply and the y represents the last line of the SVF to apply to the WUT during that point of execution. As one would skilled in the art would recognized, a line number may refer to a specific SVF function. Thus, there may be initialization code and test vectors in the same SVF file for a board. The APPLY statement defines the way in which the vectors are to be applied through its parameters and adornments.

Figure 13:
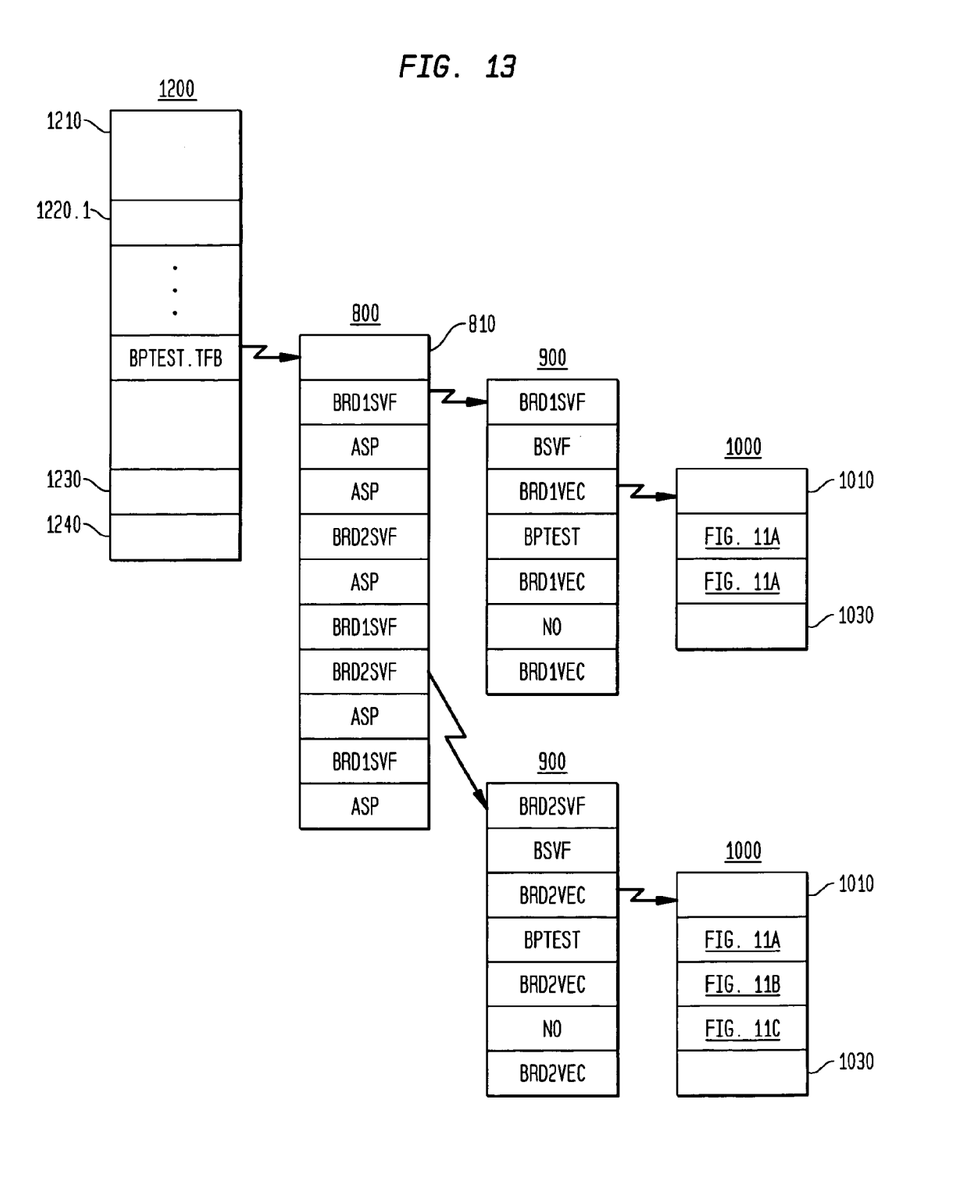
FIG. 13 illustrates the structural relationship of the data files shown in FIGS. 8–12.

FIG. 13 illustrates the relation between the data bases shown in FIGS. 8–12 with regard to the example shown above.

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A Boundary Scan test system architecture for applying test operations to a unit under test (UUT) comprising:
   a Boundary Scan services module representing Boundary Scan test operations as objects of a polymorphism, base class;
   a Test Repository Archive module having a compiled table containing TestStep types and their TestStep operations in different languages, and compiled as TestStep objects without requiring a language change, and further compiled with a corresponding interface to call a TestStep object by naming a TestStep parameter compiled with each of the TestStep objects, and wherein the corresponding interface to call comprises an object of polymorphism, virtual function derived class within the base class;
   an APPLY statement to execute the corresponding interface to call by naming the TestStep parameter;
   a Language Interpreter module to apply the Boundary Scan test operations of the base class to the UUT, and to apply the TestStep operations of TestStep objects of the virtual function derived class to the UUT, wherein,
   the Boundary Scan services module requests the Language Interpreter module to apply Boundary Scan test operations to the UUT,
   the Language Interpreter module accesses the compiled table by using the APPLY statement to execute the corresponding interface to call a TestStep object, and
   The Language Interpreter module applies the TestStep operation of a called TestStep object to the UUT.

2. The system architecture as recited in claim 1, wherein said TestStep parameter comprises one of: DIAGNOSE, ALWAYS DIAGNOSE and FROM x TO y.

3. The system architecture as recited in claim 2, wherein the APPLY statement comprises a combination of adornments: CELL, LINE, PIN, NET, VECTOR and MAXFAIL=#times.

4. The system architecture of claim 1, wherein the TestStep parameter, named by the APPLY statement to execute the corresponding interface to call a TestStep object, comprises a name of the test operation of a TestStep object to be applied to the UUT.

5. The system architecture of claim 4, wherein the APPLY statement comprises a combination of DIAGNOSE CELL, LINE, PIN, NET, VECTOR, and MAXFAIL=#TIMES; which operates to report when a failure is observed in a device Boundary Scan cell number, in a software program defined line number, in a net name of the unit under test, and in a raw vector data, respectively, and which operates to abort execution of the software program when the MAXFAIL=#TIMES failure has occurred during said execution.

6. The system architecture of claim 1, wherein the Language Interpreter module comprises a Test Flow Control Language (TFCL) Interpreter module.

7. The system architecture of claim 1, wherein,
   the Language Interpreter module communicates with a TFCLapi module, a Singleton module, an Agenda module, a Flow module and a Statement module, wherein,
   the TFCLapi module represents the interface defined by the Language Interpreter module to populate the TestStep objects and software statement objects within the Language Interpreter module,
   the Singleton module ensures one copy to exist of certain key objects for a corresponding single run-time execution using said key objects,
   the Flow module arranges the execution order of software statement objects,
   the Agenda module maintains the execution order,
   the Statement module represents an interface class defining the base structure for all software statement objects in the Language Interpreter, and
   the software statement objects comprise: Conditional Statements and the APPLY statement.

8. The system architecture of claim 7, wherein, the TestStep parameter, named by the APPLY statement to execute the corresponding interface to call a TestStep object, comprises a name of the test operation of a TestStep object to be applied to the UUT.

9. The system architecture of claim 7, wherein,
   the Conditional statements comprise: a LOOP statement, a REPEAT statement, a WHILE statement and a COMPOUND statement, wherein, the LOOP statement applies to a block of software code to be repeated until the occurrence of an event, or until attaining a desired number of iterations, the REPEAT statement applies to a block of software code to repeat execution of the same conditionally after the first execution of the same, the COMPOUND statement comprises an IF statement applied to a line of code for execution when the IF statement is a true statement, and an IF/ELSE statement applied to a corresponding line of code for execution when the IF statement is false, and the WHILE statement places a COMPOUND statement comprising a true statement at the head of the AGENDA statement for execution prior to executing all other said statements.

10. The system architecture of claim 9, wherein, the APPLY statement comprises a combination of DIAGNOSE CELL, LINE, PIN, NET, VECTOR, and MAXFAIL=#TIMES; which operates to report when a failure is observed in a device Boundary Scan cell number, in a software program defined line number, in a net name of the unit under test, and in a raw vector data, respectively, and which operates to abort execution of the software program when the MAXFAIL=#TIMES failure has occurred during said execution.

11. The system architecture of claim 10, wherein, the TestStep parameter, named by the APPLY statement to execute the corresponding interface to call a TestStep object, comprises a name of the test operation of a TestStep object to be applied to the UUT.

12. The system architecture of claim 7, wherein, the APPLY statement comprises a combination of DIAGNOSE CELL, LINE, PIN, NET, VECTOR, and MAXFAIL=#TIMES; which operates to report when a failure is observed in a device Boundary Scan cell number, in a software program defined line number, in a net name of the unit under test, and in a raw vector data, respectively, and which operates to abort execution of the software program when the MAXFAIL=#TIMES failure has occurred during said execution.

13. The system architecture of claim 12, wherein, the TestStep parameter, named by the APPLY statement to execute the corresponding interface to call a TestStep object, comprises a name of the test operation of a TestStep object to be applied to the UUT.

* * * * *